US008059639B2

(12) United States Patent
Goeke

(10) Patent No.: US 8,059,639 B2
(45) Date of Patent: Nov. 15, 2011

(54) SWITCH MATRIX

(75) Inventor: Wayne C. Goeke, Hudson, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 353 days.

(21) Appl. No.: 12/029,129

(22) Filed: Feb. 11, 2008

(65) Prior Publication Data

US 2009/0201822 A1   Aug. 13, 2009

(51) Int. Cl.
*H04L 12/50* (2006.01)

(52) U.S. Cl. ........... 370/388; 370/250; 370/387; 398/50

(58) Field of Classification Search ............... 370/388, 370/389, 387; 703/23, 13; 398/46, 50
See application file for complete search history.

(56) References Cited

U.S. PATENT DOCUMENTS

| | | | |
|---|---|---|---|
| 6,205,138 B1* | 3/2001 | Nihal et al. ................ | 370/388 |
| 6,466,343 B1* | 10/2002 | Lahat et al. ................ | 398/82 |
| 6,888,825 B1* | 5/2005 | Liu ................ | 370/359 |
| 2003/0063603 A1* | 4/2003 | Wu et al. ................ | 370/386 |
| 2005/0027505 A1* | 2/2005 | Montagne et al. ............. | 703/23 |
| 2006/0165070 A1* | 7/2006 | Hall et al. ................ | 370/369 |
| 2007/0115957 A1* | 5/2007 | Noirie et al. ................ | 370/386 |
| 2007/0127514 A1* | 6/2007 | Post et al. ................ | 370/422 |

* cited by examiner

*Primary Examiner* — Dang Ton
*Assistant Examiner* — Mandish Randhawa
(74) *Attorney, Agent, or Firm* — Pearne & Gordon LLP

(57) ABSTRACT

A switch matrix for selectively connecting at least one of N signal inputs to at least one of M signal outputs, N and M being integers greater than two, includes a cluster of N input switches arranged about each of the M signal outputs resulting in at least M clusters of N input switches, each input switch having a switch input and a switch output, the switch outputs being connected to respective signal outputs, the clusters and the input switches in the clusters being arranged to permit adjacent switch inputs of adjacent clusters to be connected to form input switch nodes; and a steering switch for each of the signal inputs. The steering switch selectably connects a signal input to an input switch node, wherein the combination of the steering switches and the input switches are operable to connect a desired signal input to a desired signal output.

2 Claims, 5 Drawing Sheets

SWITCH MATRIX

BACKGROUND OF THE INVENTION

The present invention relates to electrical test instruments and, in particular, to a switch matrix for test connections.

Referring to FIG. 1, a typical cross-point switch matrix 10 is formed from rows and columns of output lines $O_j$ and input lines $I_i$, respectively. "Switches" 12 are located at the cross points to allow connection of inputs to outputs. The switches may be, for example, simple mechanical switches, mechanical relays, or solid-state electronic equivalents thereto.

One limitation on the operation of the switch matrix 10 is that the upper frequency limit is affected by the "stub" lengths in the switch matrix 10. A stub may be considered to be a conductor connected to a signal of interest, but not actually carrying the signal from input to output. For example, when the input $I_N$ is connected to the output $O_j$, stubs include the conductor portion 14 and conductor portion 16. In general, as the number of elements in the switch matrix 10 increases, the stub effects increase, limiting the frequency of the signal that may be switched.

SUMMARY OF THE INVENTION

A switch matrix for selectively connecting at least one of N signal inputs to at least one of M signal outputs, N and M being integers greater than two, includes a cluster of N input switches arranged about each of the M signal outputs resulting in at least M clusters of N input switches, each input switch having a switch input and a switch output, the switch outputs being connected to respective signal outputs, the clusters and the input switches in the clusters being arranged to permit adjacent switch inputs of adjacent clusters to be connected to form input switch nodes; and a steering switch for each of the signal inputs. The steering switch selectably connects a signal input to an input switch node, wherein the combination of the steering switches and the input switches are operable to connect a desired signal input to a desired signal output.

DESCRIPTION OF THE PREFERRED EMBODIMENTS

Figure 1:
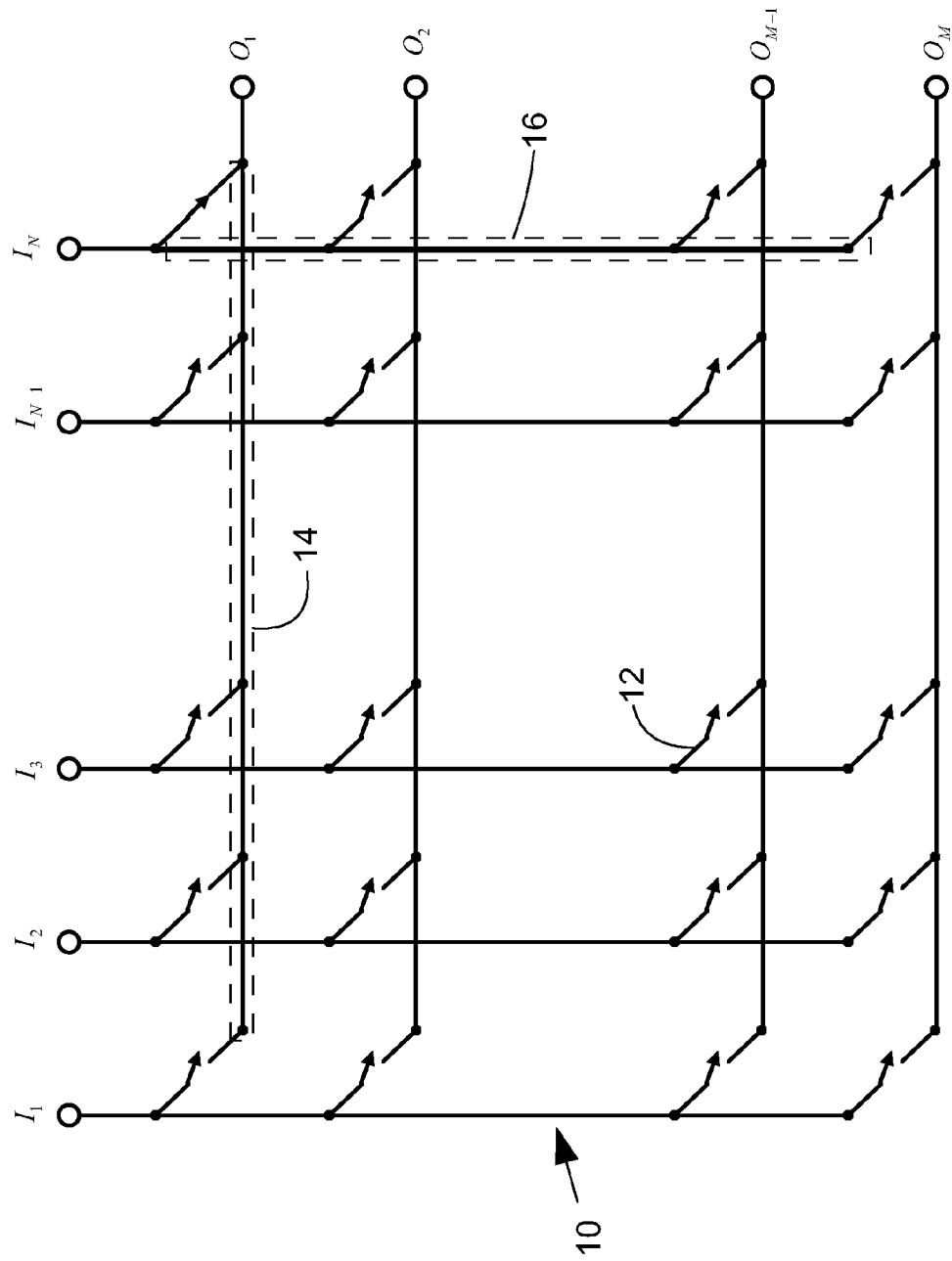
FIG. 1 is a schematic drawing of a prior art switch matrix.
Figure 2:
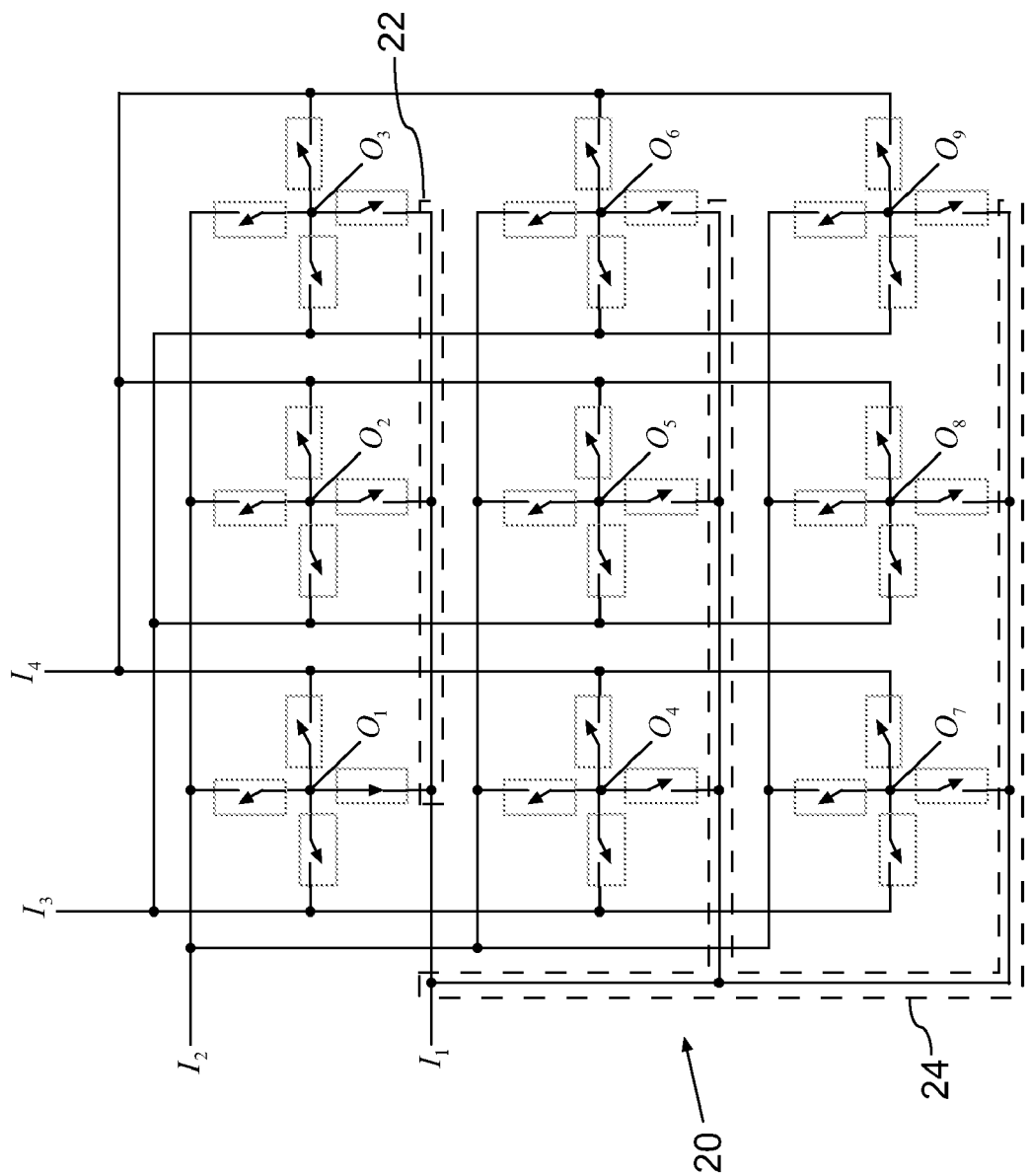
FIG. 2 is a schematic drawing of an example of a switch matrix with minimized output stub lengths.

Referring to FIG. 2, a switch matrix 20 (4×9) is configured to minimize output line stubs. The four input switches associated with each output $O_1, O_2, O_3, O_4, O_5, O_6, O_7, O_8$, and $O_9$ are clustered about the respective outputs. The stubs associated with the outputs are then little more than the connected switch leads. However, the stubs of the input lines are still substantial (in fact, probably greater than the FIG. 1 example). For example, when the input $I_i$ is connected to the output $O_1$, the input stubs are the conductor portion 22 and the conductor portion 24.

Figure 4:
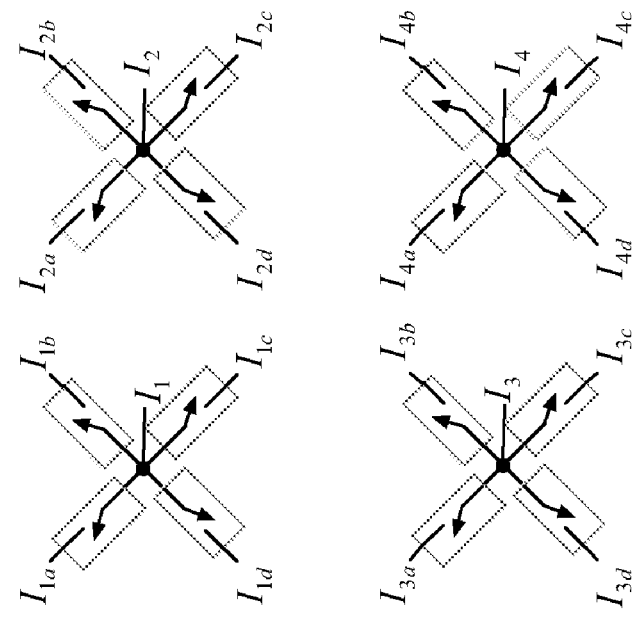
FIG. 4 is a schematic diagram of an example of an input node multiplexor for the switch matrix of FIG. 3.
Figure 3:
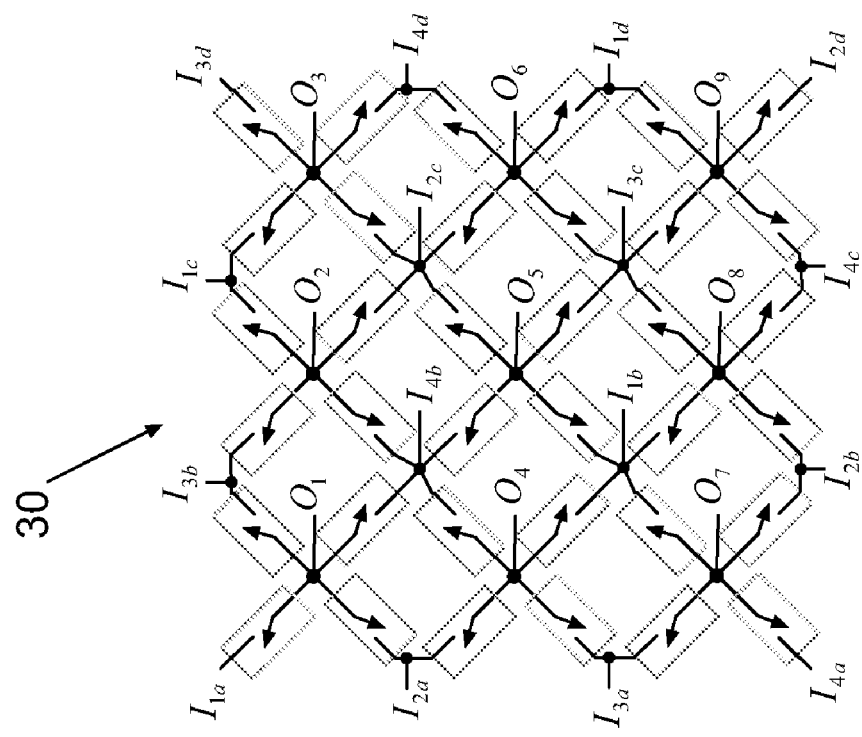
FIG. 3 is a schematic diagram of an example of a switch matrix with shared input nodes according to the invention.

Referring to FIG. 3, a switch matrix 30 (4×9) is configured similar to FIG. 2 with respect to the output clusters, but also now includes sixteen input nodes $I_{ix}$, each having stub-lengths similar to the output stubs (little more than the connected switch leads). To provide for connection of the inputs to the input nodes, an additional layer of switching is added. For example, referring to FIG. 4, each input $I_i$ is provided with a cluster of steering switches to connect the input $I_i$ to the nodes $I_{ix}$ (in this case, four nodes available for each input). There are unshown conductors between the steering clusters and the input nodes to carry the respective signals, but these will not contribute to the stub-lengths. The steering clusters may be considered to be input node multiplexors and, in fact, be implemented that way also.

Figure 5:
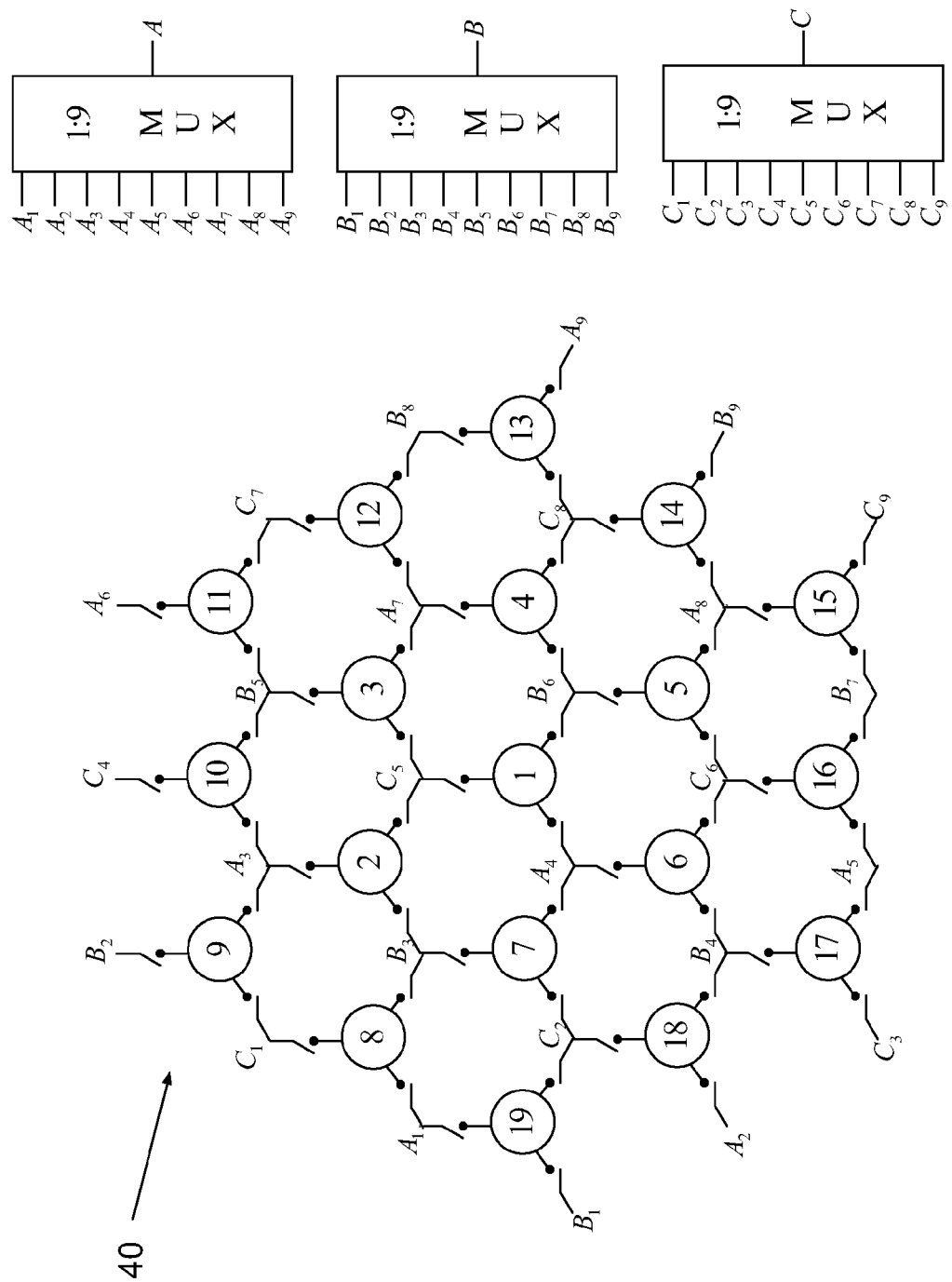
FIG. 5 is a schematic diagram of another example of a switch matrix according to the invention.

Referring to FIG. 5, a switch matrix 40 (3∴19) has nineteen output clusters (1 to 19) and twenty-seven input nodes ($A_1$ to $A_9$, $B_1$ to $B_9$ and $C_1$ to $C_9$).

Figure 6:
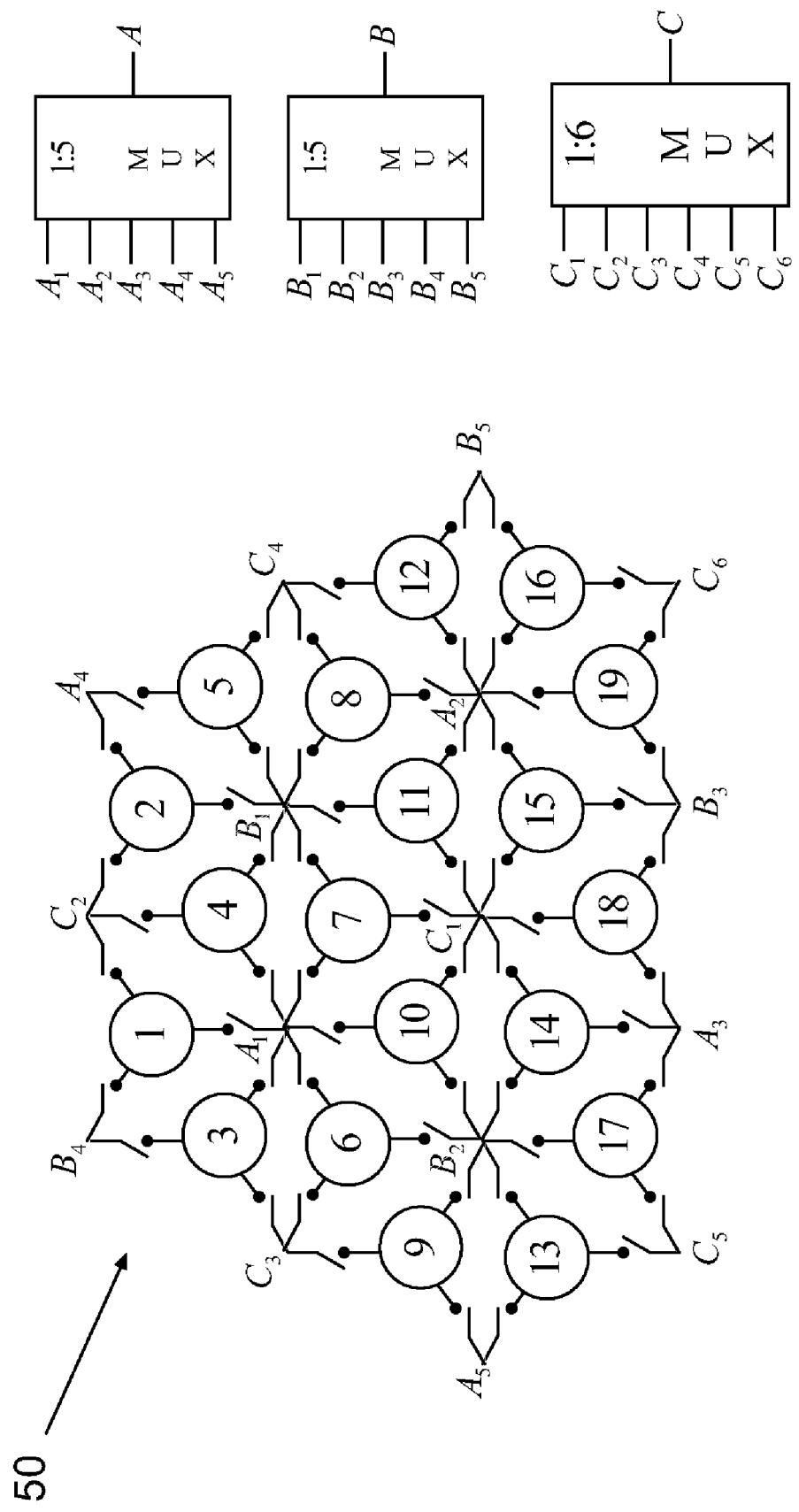
FIG. 6 is a schematic diagram of an additional switch matrix according to the invention.

Referring to FIG. 6, a switch matrix 50 (3×19) has nineteen output clusters (1 to 19) and sixteen input nodes ($A_1$ to $A_5$, $B_1$ to $B_5$ and $C_1$ to $C_6$). The larger the maximum number of outputs sharing an input node, the smaller the input multiplexors can be.

The clusters and the input switches on the clusters are arranged so that adjacent switch inputs of adjacent clusters are connected to form input switch nodes. The steering switch selectably connects a signal input to an input switch node. The combination of the steering switches and the input switches operate to connect a desired signal input to a desired signal output.

How small the cluster sizes can be are basically limited by the size of the switches in the cluster. To further increase the density, the clusters may be provided on both sides of a printed circuit board, thereby doubling the number of possible inputs.

The minimizing of the stub lengths allow the switching of higher frequency signals, e.g., 1 GHz. In addition to providing higher frequency capability, the clustering of switches may also improve DC performance by minimizing the physical locations that may need to be guarded (i.e., providing adjacent conductors driven to a virtually matching voltage to minimize leakage effects).

The switches in the above-described switch matrixes may be, for example, simple mechanical switches, mechanical relays, or solid-state electronic equivalents thereto.

The designations of input and output are largely for ease in understanding of this disclosure. In general, the designations may be reversed without significance.

While the examples above show a single switched conductor, the devices may include multiple parallel conductor switching. For example, with RF inputs and outputs it may be desirable to for each switch to switch both a signal and a ground conductor.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A switch matrix for selectively connecting at least one of N signal inputs to at least one of M signal outputs, N and M being integers greater than two, said switch matrix comprising:

a cluster of N input switches arranged about each of said M signal outputs resulting in at least M clusters of N input switches, each input switch having a switch input and a switch output, the switch outputs being connected to respective signal outputs, the clusters and the input switches in the clusters being arranged to permit adjacent switch inputs of adjacent clusters to be connected to form input switch nodes; and a steering switch for each of said signal inputs, said steering switch selectably connecting a signal input to an input switch node, wherein the combination of said steering switches and said input switches are operable to connect a desired signal input to a desired signal output.

2. The switch matrix according to claim 1, wherein said steering switches are clustered about respective signal inputs.

* * * * *